United States Patent
Dando et al.

(10) Patent No.: US 6,797,337 B2
(45) Date of Patent: Sep. 28, 2004

(54) METHOD FOR DELIVERING PRECURSORS

(75) Inventors: Ross S. Dando, Nampa, ID (US);
Craig M. Carpenter, Boise, ID (US);
Allen P. Mardian, Boise, ID (US);
Garo J. Derderian, Boise, ID (US);
Dan Gealy, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 137 days.

(21) Appl. No.: 10/223,175

(22) Filed: Aug. 19, 2002

(65) Prior Publication Data

US 2004/0083963 A1 May 6, 2004

(51) Int. Cl.⁷ .................................. B05D 3/00
(52) U.S. Cl. ..................... 427/561; 427/252; 427/253; 427/255.28; 427/255.391; 427/255.392; 427/255.393; 427/255.395; 427/595
(58) Field of Search ................ 427/252, 253, 427/255.28, 255.391, 255.392, 255.393, 255.395

(56) References Cited

U.S. PATENT DOCUMENTS

| | | |
|---|---|---|
| 4,134,514 A | 1/1979 | Schumacher et al. |
| 5,447,569 A | 9/1995 | Hiskes et al. |
| 5,476,547 A | 12/1995 | Mikoshiba et al. |
| 5,562,132 A | 10/1996 | Siegele et al. |
| 5,674,574 A | 10/1997 | Atwell et al. |
| 5,820,664 A | 10/1998 | Gardiner et al. |
| 5,820,678 A | 10/1998 | Hubert et al. |
| 5,878,793 A | 3/1999 | Siegele et al. |
| 5,879,462 A | 3/1999 | Kordina et al. |
| 6,029,717 A | 2/2000 | Siegele et al. |
| 6,056,024 A | 5/2000 | Noah et al. |
| 6,099,653 A | 8/2000 | Bhandari et al. |
| 6,148,537 A * | 11/2000 | Altamore ................ 34/97 |
| 6,179,277 B1 | 1/2001 | Huston et al. |
| 6,244,575 B1 | 6/2001 | Vaartstra et al. |
| 6,280,793 B1 | 8/2001 | Atwell et al. |
| 6,281,125 B1 | 8/2001 | Vaartstra et al. |
| 6,313,035 B1 | 11/2001 | Sandhu et al. |
| 6,322,057 B1 | 11/2001 | Lin et al. |
| 6,332,601 B1 | 12/2001 | Huston et al. |

FOREIGN PATENT DOCUMENTS

WO          WO 01/36707          5/2001

* cited by examiner

Primary Examiner—Bernard Pianalto
(74) Attorney, Agent, or Firm—Dinsmore & Shohl LLP

(57) ABSTRACT

A method and apparatus for delivering precursors to a chemical vapor deposition or atomic layer deposition chamber is provided. The apparatus includes a temperature-controlled vessel containing a precursor. An energy source is used to vaporize the precursor at its surface such that substantially no thermal decomposition of the remaining precursor occurs. The energy source may include a carrier gas, a radio frequency coupling device, or an infrared irradiation source. After the precursor is exposed to the energy source, the vaporized portion of the precursor is transported via a temperature-controlled conduit to a chemical vapor deposition or atomic deposition chamber for further processing.

29 Claims, 3 Drawing Sheets

METHOD FOR DELIVERING PRECURSORS

BACKGROUND OF THE INVENTION

The present invention relates to a method and apparatus for delivering precursors for use in chemical vapor deposition (CVD) or atomic layer deposition (ALD) processes, and more particularly, to the use of an energy source to vaporize and deliver the precursors to a process or reaction chamber without subjecting the precursors to bulk thermal decomposition.

Chemical vapor deposition (CVD) has been extensively used for preparation of films and coatings in semiconductor wafer processing. CVD is a favored deposition process in many respects because of its ability to provide highly conformal and high quality films at relatively fast processing times. Further, CVD is beneficial in coating substrates of irregular shapes, including the provision of highly conformal films even with respect to deep contacts and other openings.

Atomic layer deposition (ALD) is a relatively new process which is becoming favored as a method for achieving uniform thin deposition layers. While ALD is a slower process than CVD, ALD allows the use of precursors which are higher in reactivity because the chemical species are injected independently into an ALD reactor, which in turn allows processing at lower temperatures than conventional CVD processes.

Standard CVD and ALD processes employ precursor sources in vaporization chambers that are separated from the process or reactor chamber where the deposition surface or wafer is located. Liquid precursors are typically placed in bubblers and heated to a temperature at which they vaporize, and the vaporized liquid precursor material is then transported by a carrier gas passing over the bubbler or through the liquid precursor. The vapors are swept through a gas line to the process or reaction chamber for depositing a CVD or ALD film on a heated substrate or wafer. Many techniques have been developed to precisely control this process, and the amount of material transported to the process chamber can be precisely controlled by, for example, the temperature of the liquid precursor reservoir and by the flow of the carrier gas bubbled through or passed over the reservoir.

For example, Mikoshiba et al, U.S. Pat. No. 5,476,547 describes a gas feeding device which bubbles a carrier gas through a liquid organometallic precursor. Huston et al, U.S. Pat. No. 6,179,277 and Vaartstra et al, U.S. Pat. No. 6,244,575, both describe two-step vaporization systems for liquid organometallic precursors.

However, similar techniques have not been adequate for vaporizing solid precursors suitable for depositing CVD and ALD films. For illustration, similar techniques may include bulk sublimation of the solid precursor with transport of the vaporized solid precursor to the process chamber using a carrier gas in a manner similar to the transport of the vaporized liquid precursor. Solid precursors have generally been considered to be poor choices for CVD and ALD processes due to the difficulty of vaporizing, i.e. subliming, a solid at a controlled rate to provide a reproducible flow of vapor. However, there are many off-the-shelf solid precursors available, particularly solid organometallic precursors, which, if they could be delivered effectively and reproducibly, could be used in CVD and ALD processes.

Lack of control of solid precursor sublimation is due, at least in part, to the changing surface area of the bulk solid precursor as it is vaporized. Such a changing surface area when the bulk solid precursor is exposed to sublimation temperatures produces a continuously changing rate of vaporization, particularly for thermally sensitive compounds. This ever changing rate of vaporization results in a continuously changing and nonreproducible flow of vaporized solid precursor delivered for deposition to the process chamber. As a result, film growth rate and composition of such films deposited on wafers in the process chamber using such vaporized solid precursors cannot be controlled adequately and effectively.

Therefore, it is important to precisely control the exposure of the solid precursors to elevated temperatures to avoid bulk decomposition of the solid precursor material. However, many solid precursors, such as organometallic precursors, decompose slowly when held near their sublimation temperatures. This prevents the use of a continuously heated chemical ampoule or other vessel to maintain an elevated vapor pressure.

Accordingly, there remains a need in the art for a vapor delivery system for delivering both solid and liquid precursors, particularly thermally sensitive precursors for use in a CVD or ALD process, at a precisely controllable rate and without bulk decomposition of the precursor material during vaporization.

SUMMARY OF THE INVENTION

The present invention meets that need by providing a method and apparatus for delivering gaseous precursors to a CVD or ALD process that overcomes the above-mentioned problems by controlling the rate of vaporization at the surface of the precursor while avoiding bulk thermal decomposition of the precursor. Thus, the precursor is a phase change material which undergoes a change in phase from solid or liquid to a gaseous vapor during processing.

According to one aspect of the present invention, a method is provided for vaporizing a material such as a precursor in which a precursor vaporizer, preferably in the form of an energy source, is used to vaporize a portion of a precursor. The precursor is vaporized by exposing the surface of the precursor to the energy source. By "energy source", it is meant a source which is capable of increasing temperature to provide evaporation or sublimation of a material such as a precursor. Preferably, the energy source is selected from the group consisting of a gas, a radio frequency coupling device, and an infrared irradiation source.

Where the energy source comprises a gas, the gas preferably has a temperature of at least about 20° C. higher than the precursor. Generally, the temperature of the gas will be between about 10° C. to about 300° C., and more preferably, between about 50° C. to about 300° C. The gas is preferably a carrier gas which is non-reactive with the precursor. Suitable carrier gases include those selected from the group consisting of nitrogen, helium, and argon, or a combination thereof.

The precursor is preferably present in solid or liquid form and undergoes a phase change to a gaseous vapor when exposed to the energy source. The energy source vaporizes the surface of the precursor without heating the entire volume of the precursor such that substantially no thermal decomposition of the remaining precursor occurs. By "substantially no thermal decomposition" it is meant that the majority of the mass of the precursor maintains its thermal stability. In a preferred embodiment, the vaporized portion of the precursor is then transported to a deposition chamber such as a chemical vapor deposition or atomic layer deposition chamber for further processing.

Precursors suitable for use in the method of the present invention include both organic and inorganic metal-containing compounds. The precursors may be either in a solid or liquid form, depending upon the temperature at which the precursors are maintained and undergo a phase change during processing. As used herein, the term "metal organic" includes metal organic compounds having a central atom bonded to at least one carbon atom of a ligand as well as compounds having a central atom bonded directly to atoms other than carbon in a ligand. Preferred precursors include metal organic precursors which have at least one metal selected from the group consisting of Sr, Ba, Sc, Y, La, Ce, Ti, Zr, Hf, Pr, V, Nb, Ta, Nd, Cr, W, Pm Mn, Re, Sm, Fe, Ru, Eu, Co, Rh, Ir, Gd, Ni, Tb, Cu, Dy, Ho, Al, Tl, Er, Sn, Pb, Tm, Bi, Yb, and Si.

For example, where it is desired to deposit a titanium-containing material, the precursor will contain titanium (Ti). Suitable precursor compounds containing titanium include tetrakis-dimethyl aminotitanium, tetrakis-diethyl aminotitanium, bis(2,4-dimethyl-1,3-pentadienyl) titanium cyclopentadienyl cycloheptatrienyl titanium, dicyclooctatet-raene titanium, and biscyclopentadienyltitanium diazide. Known titanium-containing liquid precursors include titanium tetrachloride, and tetrakisdimethylamidotitanium (TDMAT). Known silicon-containing precursors include tetraethoxysilane, tetraethyl orthosilicate (TEOS). Where it is desired to deposit different metals, other known precursor compounds may be utilized.

In embodiments where the method is used to vaporize a solid precursor, the method includes exposing the surface of the solid precursor to an energy source such that the solid precursor is sublimated at its surface, preferably without heating the entire volume of the precursor.

An apparatus used in accordance with the present invention for delivering gaseous precursors includes a temperature-controlled vessel containing a solid or liquid precursor and an energy source. The energy source is preferably selected from the group consisting of a heated gas, a radio frequency coupling device, and an infrared radiation source. Preferably, the precursor is contained in a temperature-controlled vessel such as an ampoule. The vessel also includes an outlet configured to pass vaporized precursor therethrough. The apparatus further includes a temperature-controlled conduit communicating with the outlet configured to deliver the vaporized precursor to a deposition chamber such as a chemical vapor deposition or atomic layer deposition chamber.

Where the energy source comprises a gas, the vessel preferably includes an inlet for receiving the gas. The temperature of the gas entering the vessel is preferably at least about 20° C. higher than the temperature of the bulk precursor compound contained in the vessel. While the gas need not be heated if that condition is met, typically the apparatus also preferably includes a heater connected to the inlet for heating the gas prior to entering the vessel. The gas is preferably heated to a temperature of between about 10° C. to about 300° C. prior to entering the vessel.

Where the energy source comprises a radio frequency coupling device or an infrared irradiation source, these sources are preferably located outside the vessel and act on a surface of the precursor in the vessel.

Accordingly, it is a feature of the present invention to provide a method and apparatus for vaporizing and delivering precursors to a chemical vapor deposition or atomic layer deposition chamber with substantially no bulk thermal decomposition of the precursor. These, and other features and advantages of the present invention, will become apparent from the following detailed description, the accompanying drawings, and the appended claims.

DETAILED DESCRIPTION OF THE PREFERRED EMBODIMENTS

The method and apparatus of the present invention provide several advantages over prior methods of vaporizing and delivering precursors. In the present invention, the energy source is used to control the rate of sublimation of a solid precursor or control the rate of evaporation of a liquid precursor at the surface of the precursor so that the mass transport of the vaporized precursor to the process or reaction chamber is accelerated. By controlling the rate of vaporization at the surface of the precursor, the entire volume of the precursor is not heated and substantially no thermal decomposition of the remaining precursor occurs.

Further, the thermal mass of the ampoule vessel along with the mass of the precursor acts to reduce or negate the temperature increase in the bulk of the precursor caused by heated carrier gas passing through the vessel. Thus, the vessel acts as a stabilizing mass as well as a heat sink to prevent the temperature of the bulk precursor from rising to a level where thermal decomposition occurs.

The method and apparatus of the present invention allows the vaporized precursor to remain in a thermally stable condition for further processing in a chemical vapor deposition or atomic layer deposition chamber. Decomposition of the precursor that might occur due to long term exposure to elevated temperatures is reduced or eliminated. This, in turn, eliminates or reduces costs involved in replacing precursors that have degraded due to thermal exposure.

Suitable precursors for use in the present invention include both solid and liquid precursors that have heretofore been used in the semiconductor processing industry to produce metal-containing deposited materials. Preferred precursors include metal organic precursors which have at least one metal selected from the group consisting of Sr, Ba, Sc, Y, La, Ce, Ti, Zr, Hf, Pr, V, Nb, Ta, Nd, Cr, W, Pm Mn, Re, Sm, Fe, Ru, Eu, Co, Rh, Ir, Gd, Ni, Tb, Cu, Dy, Ho, Al, Tl, Er, Sn, Pb, Tm, Bi, Yb, and Si.

For example, where it is desired to deposit a titanium-containing material, the precursor will contain titanium (Ti). Suitable precursor compounds containing titanium include of tetrakis-dimethyl aminotitanium, tetrakis-diethyl aminotitanium, bis(2,4-dimethyl-1,3-pentadienyl) titanium cyclopentadienyl cycloheptatrienyl titanium, dicyclooctatet-raene titanium, and biscyclopentadienyltitanium diazide. Known titanium-containing liquid precursors include titanium tetrachloride, and tetrakisdimethylamidotitanium (TDMAT). Known silicon-containing precursors include tetraethoxysilane, tetraethyl orthosilicate (TEOS). Where it is desired to deposit different metals, other known precursor compounds may be utilized.

Figure 1:
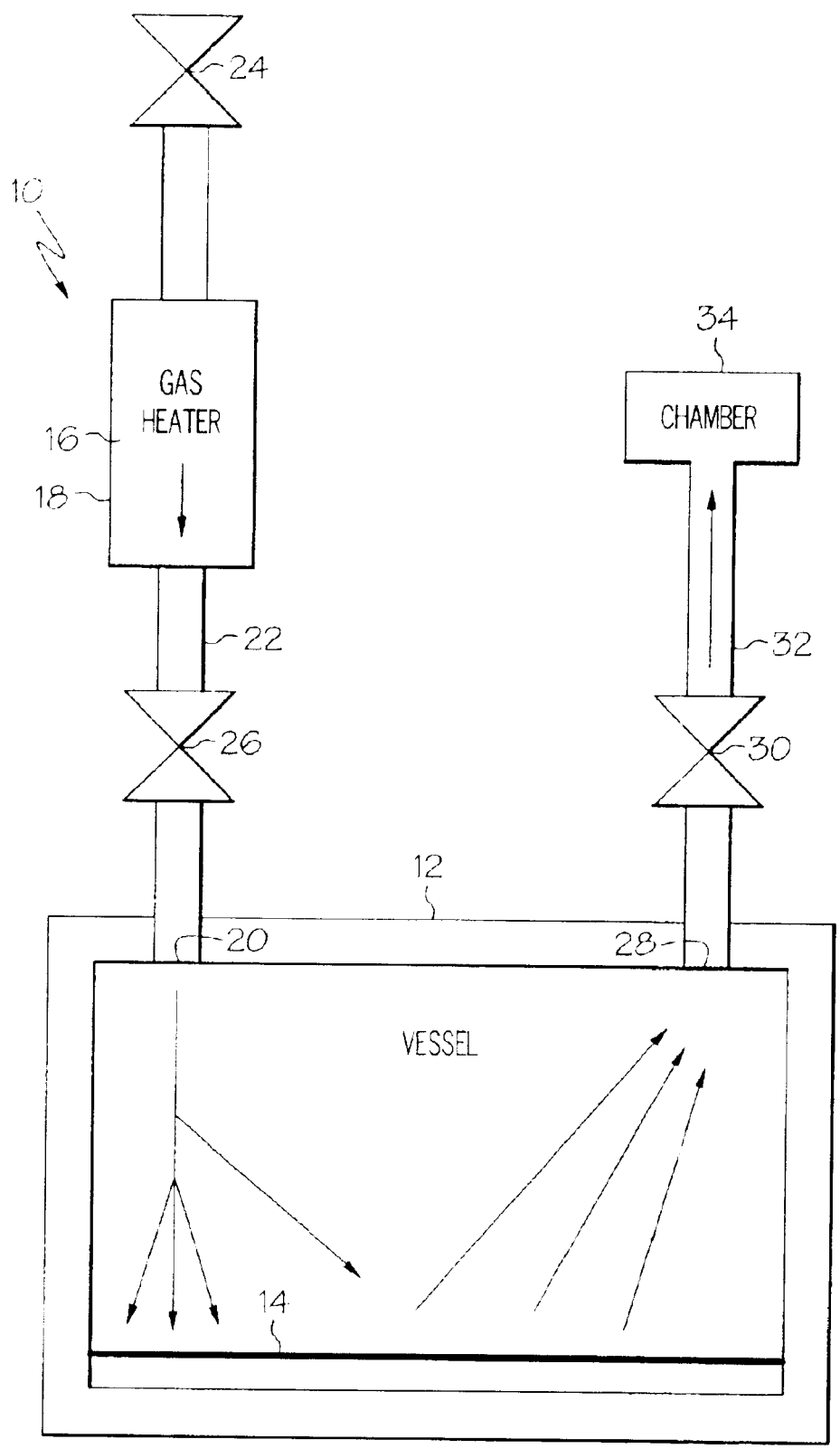
FIG. 1 is a schematic view of an apparatus for vaporizing and delivering a precursor in accordance with one embodiment of the present invention.

Referring now to FIG. 1, an apparatus 10 for vaporizing and delivering precursors to a chemical vapor deposition or atomic layer deposition chamber is shown. The apparatus 10 includes a vessel 12 such as an ampoule that contains a solid or liquid precursor 14. The vessel 12 is preferably comprised of a thermally conductive material that is non-reactive with the precursor. Suitable thermally conductive materials include metals such as stainless steel and/or aluminum. The vessel 12 is of a suitable size and capacity for the amount of precursor required for use in the process. For vaporization of solid or liquid precursors, the temperature of the vessel is preferably controlled at a temperature of from between about −200° C. to about 200° C. Heating and/or cooling elements may be used to control the temperature within a desired range.

In the embodiment shown, a carrier gas 16 is used as the energy source for vaporizing the precursor which undergoes a phase change from its bulk solid or liquid form. By "carrier gas", it is meant a gas or combination of gases that are non-reactive with the precursor under the processing conditions used. The carrier gas may comprise any of a number of inert gases including helium, nitrogen, neon, argon, or a combination thereof. In the embodiment that is shown, the apparatus includes a gas heater 18 for preheating the carrier gas prior to entering the vessel 12. Suitably, the temperature of the carrier gas need be only about 20° C. higher than the temperature of the precursor, although, depending upon the volume of precursor needed, the flow rate of the carrier gas, and the vapor pressure of the precursor, a greater temperature differential may be useful. The carrier gas is preferably heated to a temperature of between about 10° C. and about 300° C., and more preferably, between about 50° C. and about 300° C. It should be appreciated that the temperature of the gas will vary depending on the temperature and vapor pressure of the precursor, the composition of the precursor, and other process parameters such as flow rates, etc. The carrier gas is preferably heated to a temperature so as to be the primary source of heat for vaporizing the solid or liquid precursor.

The vessel includes an inlet 20 for receiving the carrier gas 16. The desired carrier gas flows through a conduit 22 and is controlled by valves 24 and 26. The carrier gas enters the vessel 12 through inlet 20 and is flowed over the surface area of the precursor 14 such that the precursor is vaporized at its surface.

The vaporized portion of the precursor 14 then exits the vessel 12 through an outlet 28 controlled by outlet valve 30 and is carried along with the carrier gas through a conduit 32 to a chemical vapor deposition or atomic layer deposition chamber 34. The vaporized precursor can then be processed as desired in the chamber 34.

The conduit 22 and the conduit 32 may comprise stainless steel tubing or the like. The tubing is sized to provide the necessary volume of materials to the deposition chamber. The conduit 32 is preferably maintained at temperature that is conducive to the thermal stability of the particular precursor being used. The temperature of the conduit may be maintained at a temperature that is less than, equal to, or greater than the temperature of the heated carrier gas.

Figure 2:
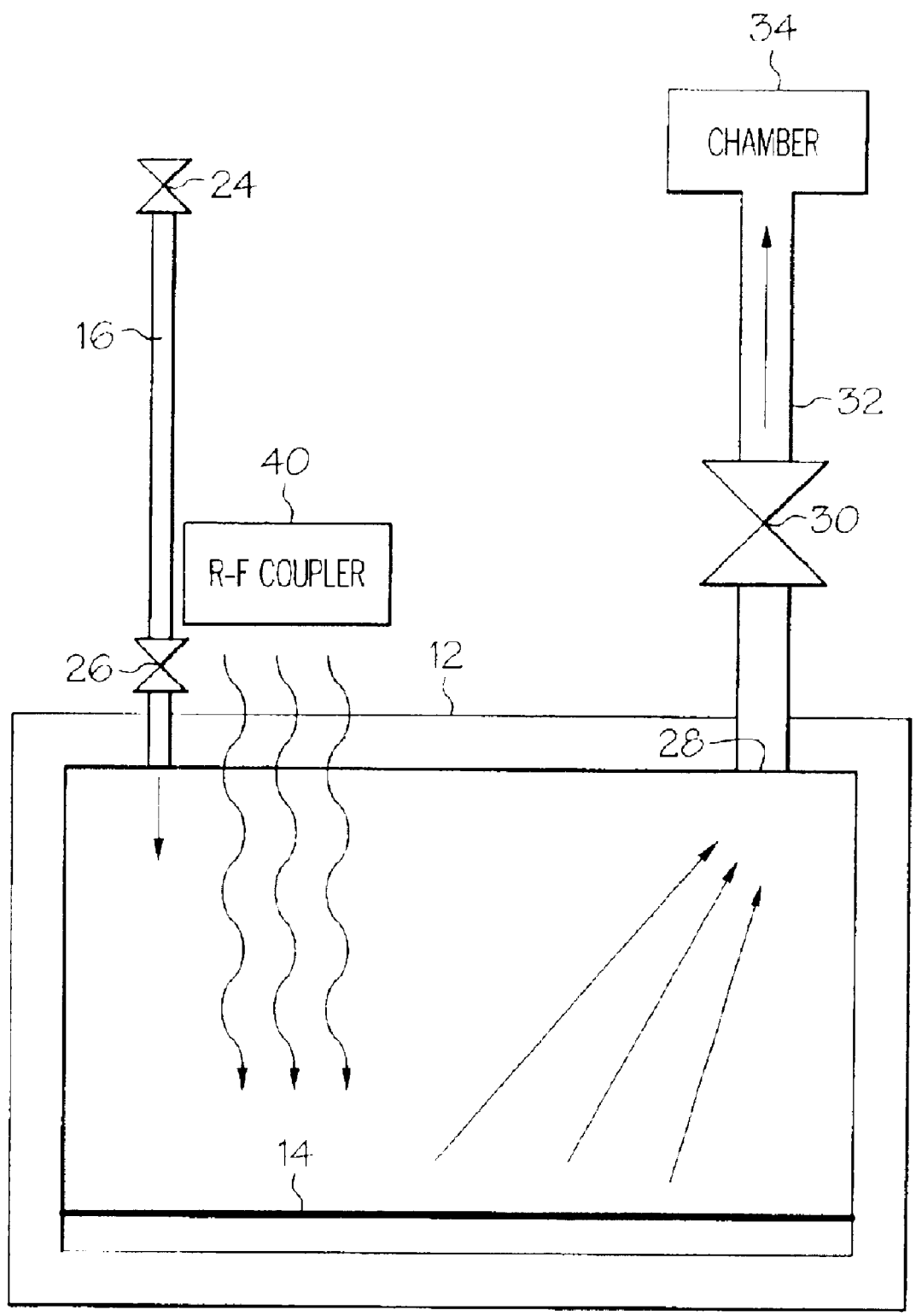
FIG. 2 is a schematic view of the apparatus including a radio frequency (rf) coupling device in accordance with an alternative embodiment of the present invention.

FIG. 2 illustrates an alternative embodiment of the invention in which the apparatus includes an rf coupling device 40 which is used as the energy source for vaporizing the precursor. As shown, device 40 is located outside the vessel but may also be located inside the vessel. The device utilizes radio frequency current to vaporize the precursor 14 at its surface by flash vaporization. The vaporized precursor is then carried by carrier gas 16 and exits the vessel 12 through outlet 28 for further processing as described above. It should be appreciated that in this embodiment, the carrier gas is not heated and does not act as an energy source, but it used to carry the vaporized precursor to the chamber 34. However, it is within the scope of the present invention to utilize both the rf coupling device 40 and carrier gas as dual energy sources.

Figure 3:
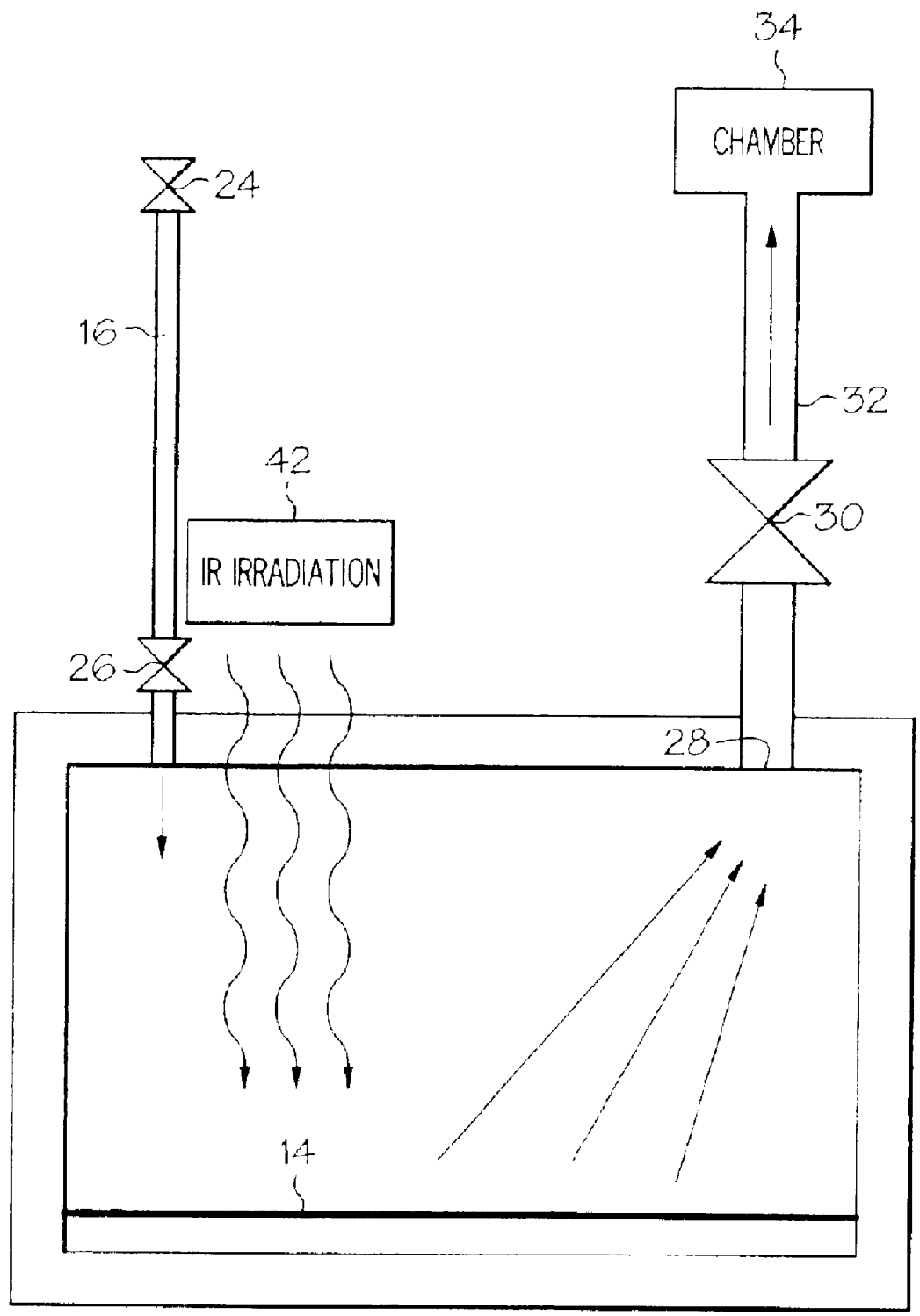
FIG. 3 is a schematic view of the apparatus including an infrared (IR) irradiation device in accordance with another alternative embodiment of the present invention.

FIG. 3 illustrates another alternative embodiment of the invention in which the apparatus includes an IR radiation source 42 as the energy source. The radiation source may be located inside or outside the vessel. The solid or liquid precursor 14 is vaporized at its surface by the radiation via flash vaporization. The vaporized precursor is then transported by the carrier gas 16 to the processing chamber as described above. Again, the carrier gas may either be unheated and simply used as a transport mechanism, or may be used in combination with the radiation source as dual sources of energy.

While certain representative embodiments and details have been shown for the purpose of illustrating the invention, it will be apparent to those skilled in the art that various changes in the methods and apparatus disclosed herein may be made without departing from the scope of the invention, which is defined in the appended claims.

What is claimed is:

1. A method for vaporizing a precursor comprising:

providing an energy source, providing a precursor and exposing the surface of said precursor to said energy source; and vaporizing a portion of said precursor such that substantially no thermal decomposition of the remaining precursor occurs.

2. The method of claim 1 wherein only a portion of the volume of said precursor is heated.

3. The method of claim 1 wherein said energy source is selected from the group consisting of a gas, a radio frequency coupling device, and an infrared radiation source.

4. The method of claim 3 wherein said energy source comprises a gas having a temperature of at least about 20° C. higher than said precursor.

5. The method of claim 4 wherein the temperature of said gas is between about 10° to about 300° C.

6. The method of claim 5 wherein the temperature of said gas is between about 50° to about 300° C.

7. The method of claim 1 wherein said precursor is contained in a temperature-controlled vessel.

8. The method of claim 3 wherein said gas is a carrier gas selected from the group consisting of nitrogen, helium, neon, and argon, or a combination thereof.

9. The method of claim 1 in which said energy source comprises a radio frequency coupling device.

10. The method of claim 1 in which said energy source comprises an infrared radiation source.

11. The method of claim 1 wherein said precursor comprises a solid.

12. The method of claim 1 wherein said precursor comprises a liquid.

13. The method of claim 1 wherein said solid precursor comprises a metal organic compound.

14. The method of claim 13 wherein said metal organic compound contains at least one metal selected from the group consisting of Sr, Ba, Sc, Y, La, Ce, Ti, Zr, Hf, Pr, V, Nb, Ta, Nd, Cr, W, Pm Mn, Re, Sm, Fe, Ru, Eu, Co, Rh, Jr, Gd, Ni, Tb, Cu, Dy, Ho, Al, Tl, Er, Sn, Pb, Tm, Bi, Yb, and Si.

15. The method of claim 14 wherein said metal comprises Ti.

16. The method of claim 15 where said metal organic compound is selected from the group consisting of tetrakis-dimethyl aminotitanium, tetrakis-diethyl aminotitanium, bis (2,4-dimethyl-1,3-pentadienyl) titanium cyclopentadienyl cycloheptatrienyl titanium, dicyclooctatetraene titanium, and biscyclopentadienyltitanium diazide.

17. The method of claim 1 wherein said precursor comprises a liquid and is selected from the group consisting of tetraethoxysilane, tetraethyl orthosilicate, titanium tetrachloride, and tetrakisdimethylamidotitanium.

18. The method of claim 1 further comprising transporting the vaporized portion of said precursor to a deposition chamber.

19. A method for providing a gaseous precursor comprising:
providing a solid or liquid precursor;
exposing the surface of said precursor to a gas having a temperature of at least about 20° C. greater than the temperature of said precursor to vaporize a portion of said precursor such that substantially no thermal decomposition of the remaining precursor occurs.

20. The method of claim 19 wherein said precursor is a solid.

21. A method for vaporizing a precursor comprising:
providing a precursor;
exposing said precursor to radio frequency energy;
vaporizing a portion of said precursor using said radio frequency energy; and
avoiding bulk thermal decomposition of said precursor during vaporization.

22. A method for vaporizing a precursor:
providing a precursor;
exposing said precursor to infrared radiation;
vaporizing a portion of said precursor using said infrared radiation; and
maintaining thermal stability of a majority of precursor mass despite said exposing act.

23. A method for providing a gaseous precursor comprising:
providing a solid precursor;
heating the surface of said solid precursor to sublime a portion of said precursor such that substantially no thermal decomposition of the remaining precursor occurs.

24. The method of claim 23 wherein heating the surface of said precursor comprises exposing said precursor to radio frequency energy.

25. The method of claim 23 wherein heating the surface of said precursor comprises exposing said precursor to infrared radiation.

26. A method for sublimating a solid precursor comprising:
providing an energy source, said energy source selected from the group consisting of a gas, a radio frequency coupling device, and an infrared radiation source;
providing a solid precursor and exposing the surface of said solid precursor to said energy source such that said solid precursor is sublimated generally only at its surface.

27. The method of claim 26 wherein said solid precursor is sublimated without heating the entire volume of said precursor.

28. A method for vaporizing a precursor comprising:
providing a precursor vaporizer;
providing a precursor;
exposing a surface of said precursor to said precursor vaporizer; and
maintaining a generally constant surface area of said precursor during said exposing act.

29. The method of claim 28 wherein said precursor vaporizer comprises an energy source selected from the group consisting of a gas, a radio frequency coupling device, and an infrared radiation source.

* * * * *

UNITED STATES PATENT AND TRADEMARK OFFICE
CERTIFICATE OF CORRECTION

PATENT NO. : 6,797,337 B2
DATED : September 28, 2004
INVENTOR(S) : Dando et al.

It is certified that error appears in the above-identified patent and that said Letters Patent is hereby corrected as shown below:

Column 6,
Line 65, "Jr," should read -- Ir, --

Signed and Sealed this

Third Day of May, 2005

JON W. DUDAS
*Director of the United States Patent and Trademark Office*